(12) United States Patent
Choi et al.

(10) Patent No.: US 12,666,620 B2
(45) Date of Patent: Jun. 23, 2026

(54) SEMICONDUCTOR DEVICE AND MANUFACTURING METHOD OF A SEMICONDUCTOR DEVICE

(71) Applicant: SK hynix Inc., Gyeonggi-do (KR)

(72) Inventors: Seok Min Choi, Gyeonggi-do (KR); Jung Shik Jang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 350 days.

(21) Appl. No.: 18/457,338

(22) Filed: Aug. 29, 2023

(65) Prior Publication Data

US 2024/0389327 A1    Nov. 21, 2024

(30) Foreign Application Priority Data

May 17, 2023    (KR) ........................ 10-2023-0063774

(51) Int. Cl.
| | |
|---|---|
| *H01L 21/77* | (2017.01) |
| *H10B 41/27* | (2023.01) |
| *H10B 41/35* | (2023.01) |
| *H10B 43/27* | (2023.01) |
| *H10B 43/35* | (2023.01) |

(52) U.S. Cl.
CPC ............. *H10B 43/35* (2023.02); *H10B 41/27* (2023.02); *H10B 41/35* (2023.02); *H10B 43/27* (2023.02)

(58) Field of Classification Search
CPC ........ H10B 43/35; H10B 41/27; H10B 41/35; H10B 43/27; H10B 43/30; H10B 41/30; H10B 41/10; H10B 41/50; H10B 43/10; H10B 43/50

USPC ......................................................... 257/314
See application file for complete search history.

(56)    References Cited

U.S. PATENT DOCUMENTS

| | | | | |
|---|---|---|---|---|
| 5,379,254 | A * | 1/1995 | Chang ................ | G11C 16/0491 |
| | | | | 365/185.11 |
| 8,711,630 | B2 * | 4/2014 | Aritome ............. | G11C 16/3427 |
| | | | | 365/185.28 |
| 8,969,948 | B2 * | 3/2015 | Simsek-Ege ........ | H01L 21/3088 |
| | | | | 257/326 |
| 9,276,011 | B2 * | 3/2016 | Simsek-Ege ........... | H10B 41/23 |
| 9,330,763 | B1 * | 5/2016 | Zhang .................... | G11C 16/26 |
| 9,431,410 | B2 * | 8/2016 | Sun .................... | H10D 30/0411 |
| 9,460,931 | B2 * | 10/2016 | Pachamuthu ........ | H10D 64/035 |
| 9,899,408 | B2 * | 2/2018 | Son ........................ | H10B 43/35 |
| 10,229,928 | B2 * | 3/2019 | Sun ........................ | H10B 43/27 |
| 10,290,650 | B1 * | 5/2019 | Iwai ................... | H10D 30/0413 |
| 10,373,968 | B2 | 8/2019 | Huo | |
| 10,490,568 | B2 | 11/2019 | Kai et al. | |
| 10,559,591 | B2 * | 2/2020 | Kanamori ........... | H01L 23/5329 |
| 10,797,060 | B2 * | 10/2020 | Sharangpani ........ | H10D 84/013 |
| 10,903,233 | B2 * | 1/2021 | Nakaki ............. | H01L 21/02238 |
| 11,322,508 | B2 * | 5/2022 | Parat ..................... | H10B 41/27 |

(Continued)

*Primary Examiner* — Vu A Vu
(74) *Attorney, Agent, or Firm* — IP & T GROUP LLP

(57)    ABSTRACT

A semiconductor device may include: a plurality of word lines; a select line; a channel layer extending into the select line through the word lines; a floating gate surrounding sidewalls of the channel layer between the channel layer and the select line; and a charge trap layer including a first and a second portion, wherein the first portion surrounds the sidewalls of the channel layer between the channel layer and the word lines and the second portion surrounds the floating gate between the channel layer and the select line.

20 Claims, 19 Drawing Sheets

(56)         References Cited

U.S. PATENT DOCUMENTS

| | | | | |
|---|---|---|---|---|
| 11,393,844 B2 * | 7/2022 | Wu | .................. | H01L 21/32155 |
| 11,895,839 B2 * | 2/2024 | Takekida | .............. | H10B 43/27 |

* cited by examiner

C-C'

1

SEMICONDUCTOR DEVICE AND MANUFACTURING METHOD OF A SEMICONDUCTOR DEVICE

CROSS-REFERENCE TO RELATED APPLICATION

This application claims priority under 35 U.S.C. § 119 to Korean Patent Application No. 10-2023-0063774 filed on May 17, 2023, which is incorporated herein by reference in its entirety.

BACKGROUND

1. Technical Field

Embodiments of the present invention disclosure relate generally to an electronic device and, more particularly, to a semiconductor device and a manufacturing method of the semiconductor device.

2. Related Art

The degree of integration of a semiconductor device is mainly determined by the area occupied by a unit memory cell. Recently, as the improvement in the degree of integration of a semiconductor device for forming memory cells in a single layer on a substrate reaches a limit, a three-dimensional semiconductor device which stacks memory cells in a three-dimensional structure over a substrate has been proposed. Furthermore, in order to improve the structural and operational reliability and performance characteristics of such a three-dimensional semiconductor device, various structures and manufacturing methods are developed.

SUMMARY

In an embodiment, a semiconductor device may include: a plurality of word lines; a select line; a channel layer extending into the select line through the word lines; a floating gate surrounding sidewalls of the channel layer between the channel layer and the select line; and a charge trap layer including a first and a second portion, wherein the first portion surrounds the sidewalls of the channel layer between the channel layer and the word lines and the second portion surrounds the floating gate between the channel layer and the select line.

In an embodiment, a semiconductor device may include: a gate structure including first conductive layers and insulating layers that are alternately stacked; a second conductive layer; an isolation structure extending into the gate structure through the second conductive layer; a channel layer extending into the gate structure through the second conductive layer, and including a cutting surface facing the isolation structure; and a floating gate partially surrounding the channel layer and located between the channel layer and the second conductive layer.

In an embodiment, a semiconductor device may include: a source line; a bit line; and a memory string connected between the source line and the bit line, and including a first select transistor including a charge trap layer and a floating gate and memory cells each including the charge trap layer.

In an embodiment, a manufacturing method of a semiconductor device may include: forming a stack including first material layers and insulating layers that are alternately stacked; forming a second material layer on the stack; forming a first opening extending into the stack through the second material layer; forming a second opening by etching the second material layer through the first opening; forming a first memory layer in the first opening and the second opening; forming a second memory layer in the second opening; and forming a channel layer in the first opening.

In an embodiment, a manufacturing method of a semiconductor device may include: forming a stack including first material layers and insulating layers that are alternately stacked; forming a second material layer on a stack; forming a channel structure including a channel layer extending into the stack through the second material layer and a floating gate located between the channel layer and the second material layer; forming, in the stack, a trench that partially cuts the channel structure; and forming an isolation structure in the trench.

These and other features and advantages will become better understood by the skilled person from the following figures and detailed description of the present invention.

DETAILED DESCRIPTION

Various embodiments are directed to a semiconductor device having a stable three-dimensional structure, and improved reliability and performance characteristics. Various embodiments are also directed to a manufacturing method of the semiconductor device.

By stacking memory cells in three dimensions, it is possible to improve the degree of integration of a semiconductor device. It is also possible to provide a semiconductor device having a stable structure and improved reliability.

Hereafter, embodiments in accordance with the technical spirit of the present invention disclosure will be described with reference to the accompanying drawings.

Figure 1A:
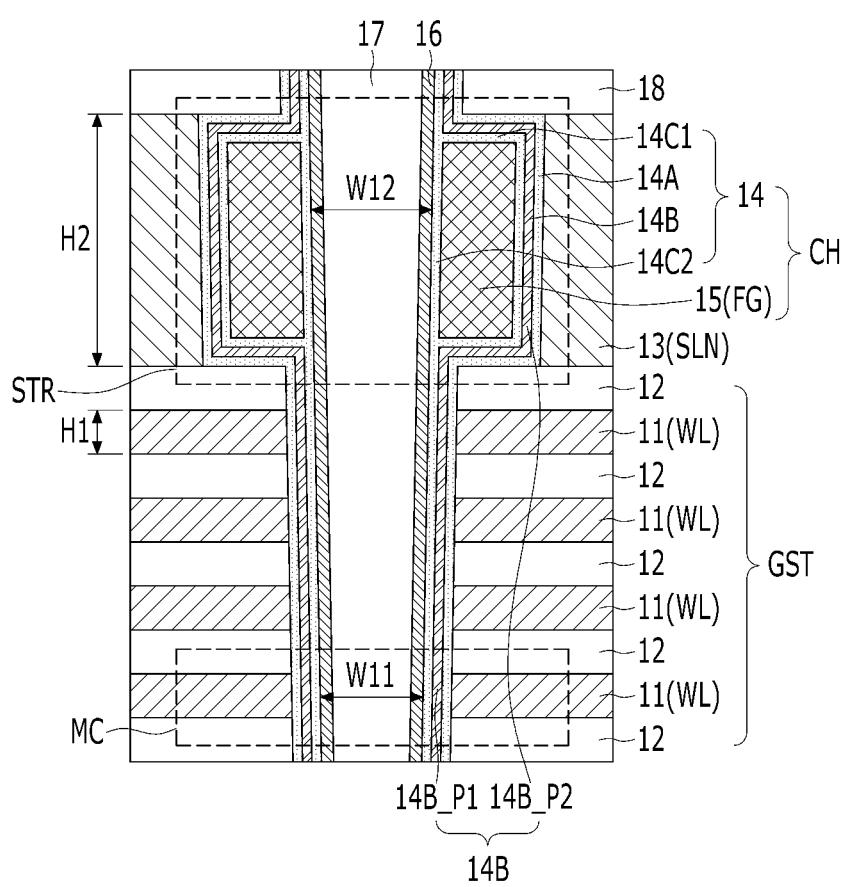
FIGS. 1A to 1C are diagrams illustrating the structure of a semiconductor device in accordance with an embodiment.
Figure 1B:
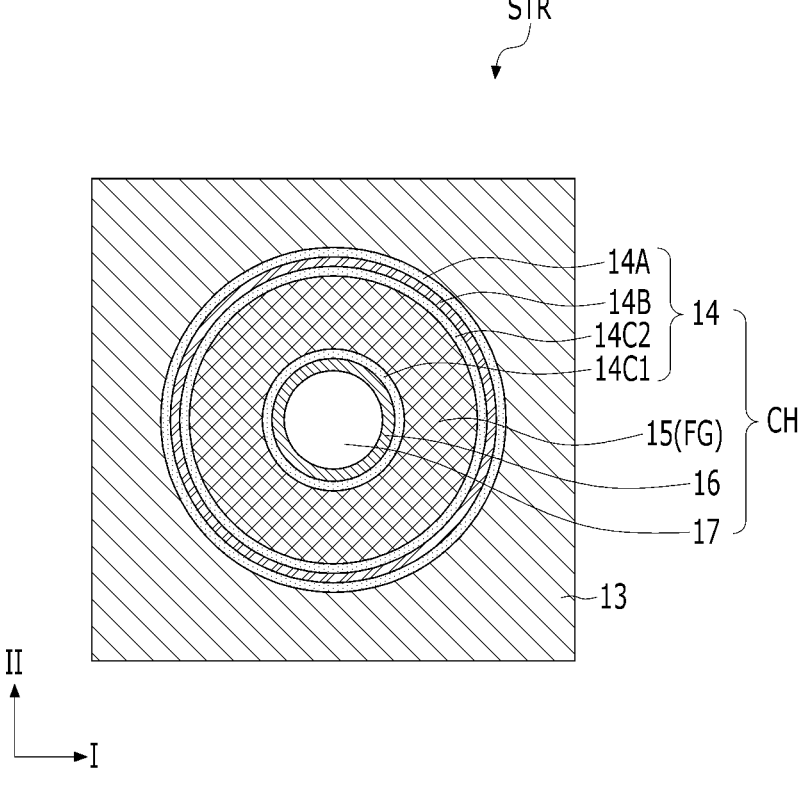
Figure 1C:
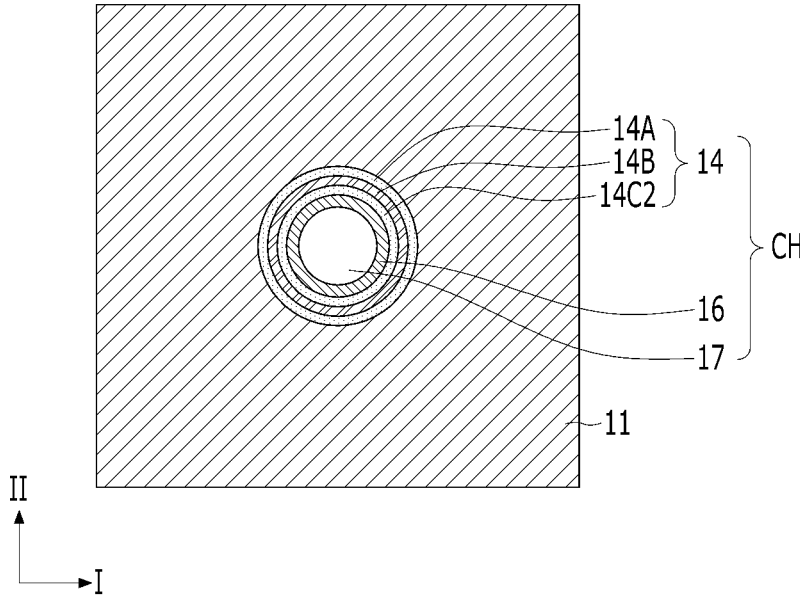

FIGS. 1A to 1C are diagrams illustrating the structure of a semiconductor device in accordance with an embodiment. FIG. 1A is a cross-sectional view, FIG. 1B is a plan view of a select transistor, and FIG. 1C is a plan view of a memory cell.

Referring to FIG. 1A, the semiconductor device may include a gate structure GST, a second conductive layer 13, and a channel structure CH. The semiconductor device may further include a second insulating layer 18 or an insulating core 17, or a combination thereof.

The gate structure GST may include first conductive layers 11 and first insulating layers 12 that are alternately stacked. The second conductive layer 13 may be located on the gate structure GST. As an example, at least one second conductive layer 13 and at least one second insulating layer 18 may be alternately stacked on the gate structure GST. The first conductive layers 11 and the second conductive layer 13 may be gate lines such as word lines WL and select lines SLN, respectively. As an example illustrated in FIG. 1A, the second conductive layer 13 may be a select line SLN, and the first conductive layers 11 may be word lines WL. As another example (not shown), the second conductive layer 13 and at least a lowermost one of the first conductive layers 11 may be select lines SLN, and the other first conductive layers 11 may be the word lines WL. The select line SLN may be a source select line or a drain select line.

The first conductive layers 11 and the second conductive layer 13 may each include a conductive material such as polysilicon, metal, or metal silicide. The metal may include at least one of tungsten (W), molybdenum (Mo), cobalt (Co), nickel (Ni), hafnium (Hf), and platinum (Pt). Furthermore, the first conductive layers 11 and the second conductive layer 13 may each include a metal barrier. The metal barrier may include metal nitride such as tungsten nitride (WN), tantalum nitride (TaN), or titanium nitride (TiN).

The second conductive layer 13 may include a material equal to the first conductive layer 11. The second conductive layer 13 may include a material different from the first conductive layer 11. As an example, the select line SLN and the word line WL may each include a metal. As another example, the select line SLN may include polysilicon and the word line WL may include a metal such as tungsten or molybdenum. The select line SLN may be a polysilicon layer doped with N-type or P-type impurities or an undoped polysilicon layer. The Fermi level of the polysilicon layer may be adjusted by doping the select line SLN with N-type or P-type impurities, so that a threshold voltage Vth of a select transistor STR may be adjusted.

The second conductive layer 13 may have a height substantially equal to or different from that of the first conductive layer 11. As an example, the select line SLN may have a greater height than each of the word lines WL.

The first insulating layers 12 and the second insulating layer 18 may be used to insulate the stacked first conductive layers 11 and second conductive layer 13 from each other. The first insulating layer 12 and the second insulating layer 18 may each include an insulating material such as an oxide, a nitride, an air gap, or a void.

The channel structure CH may extend into the gate structure GST through the second conductive layer 13. The channel structure CH may include at least one of a first memory layer 14, a second memory layer 15, and a channel layer 16. The channel layer 16 may extend into the gate structure GST through the second conductive layer 13. The channel layer 16 may extend into the select line SLN through the word lines WL. The channel layer 16 may include a semiconductor material such as silicon or germanium. The channel layer 16 may have a uniform width, or may have different widths according to levels. As an example, a lower width may be smaller than an upper width, or the upper width may be smaller than the lower width. The insulating core 17 may be located in the channel layer 16.

The first memory layer 14 may surround the channel layer 16 and may be located between the channel layer 16 and the gate structure GST. The first memory layer 14 may include a floating gate, a charge trap material, a variable resistance material, or the like, or a combination thereof. As an example, the first memory layer 14 may include a second tunneling layer 14C2, a charge trap layer 14B, or a blocking layer 14A, or a combination thereof. The second tunneling layer 14C2 may be located between the channel layer 16 and the charge trap layer 14B, and may surround the channel layer 16. The charge trap layer 14B may surround the second tunneling layer 14C2, and the blocking layer 14A may surround the charge trap layer 14B.

The first memory layer 14 may extend between the channel layer 16 and the second conductive layer 13. The second memory layer 15 may be located between the channel layer 16 and the second conductive layer 13, and the second memory layer 15 may be located in the first memory layer 14. The second memory layer 15 may be located between the second tunneling layer 14C2 and the charge trap layer 14B. As an example, the second memory layer 15 may include a floating gate FG, a charge trap material, a variable resistance material, or the like, or a combination thereof. The second tunneling layer 14C2 may extend between the channel layer 16 and the floating gate FG. The charge trap layer 14B and the blocking layer 14A may surround the floating gate FG, and may be located between the floating gate FG and the select line SLN.

The first memory layer 14 may further include a first tunneling layer 14C1. The first tunneling layer 14C1 may be located between the floating gate FG and the charge trap layer 14B. The first tunneling layer 14C1 may surround an outer wall of the floating gate FG, and have a C-shaped cross section. The second tunneling layer 14C2 may surround an inner wall of the floating gate FG.

The charge trap layer 14B may include a first portion 14B_P1 and a second portion 14B_P2. The first portion 14B_P1 may be located in the gate structure GST. The first portion 14B_P1 may surround the channel layer 16 between the channel layer 16 and the word lines WL. The second tunneling layer 14C2 may be located between the channel layer 16 and the first portion 14B_P1, and the first portion 14B_P1 may surround the second tunneling layer 14C2. The second portion 14B_P2 may be located in the second conductive layer 13 and may surround the floating gate FG between the channel layer 16 and the select line SLN.

The select transistor STR may be located in a region where the channel layer 16 and the select line SLN intersect each other. As an example, a source select transistor may be located in a region where the channel layer 16 and the source select line intersect each other. A drain select transistor may be located in a region where the channel layer 16 and the drain select line intersect each other. Referring to FIG. 1B, the channel structure CH of the select transistor STR may have a circular cross-sectional shape in a plane defined by a first direction I and a second direction II. The channel structure CH of the select transistor STR may have other shapes such as an elliptical shape, or a polygonal shape in the plane. Meanwhile, the channel structure CH in FIG. 1B is illustrated to have a normal shape that is not cut. However, a portion of the channel structure CH may be cut during a manufacturing process and such a case will be described with reference to FIGS. 3A to 3D.

The select transistor STR may include the channel layer 16, the first memory layer 14, and the second memory layer 15. The select transistor STR may include the charge trap layer 14B and the floating gate FG. The first memory layer 14 may include the first tunneling layer 14C1, the second tunneling layer 14C2, the charge trap layer 14B, and the blocking layer 14A, and the second memory layer 15 may include the floating gate FG.

Memory cells MC may be located in regions where the channel layer 16 and the word lines WL intersect each other. Referring to FIG. 1C, the channel structure CH of the memory cell MC may have a circular cross-sectional shape in the plane defined by the first direction I and the second direction II. The channel structure CH of the memory cell 10) MC may have other shapes such as an elliptical shape, or a polygonal shape in the plane. Meanwhile, the channel structure CH in FIG. 1C is illustrated to have a normal shape that is not cut. However, a portion of the channel structure CH may be cut during a manufacturing process and such a case will be described with reference to FIGS. 3A to 3D. The memory cell MC may include the charge trap layer 14B. The memory cell MC may include the first memory layer 14, the channel layer 16, and the insulating core 17. The first memory layer 14 may include the second tunneling layer 14C2, the charge trap layer 14B, and the blocking layer 14A.

The channel layer 16 of the memory cell MC and the channel layer 16 of the select transistor STR may have substantially the same width or different widths. As an example, the memory cells MC may be located below the select transistor STR. The channel layer 16 of the memory cell MC may have a narrower width than the channel layer 16 of the select transistor STR. The channel layer 16 of the select transistor STR may have a second width W12, and the channel layer 16 of the memory cell MC may have a first width W11 smaller than the second width W12.

According to the structure described above, each of the select transistor STR and the memory cell MC may include at least one of the floating gate FG and the charge trap layer 14B in consideration of operating characteristics.

The memory cell MC may include the charge trap layer 14B and include no floating gate FG. In terms of the operation characteristics, an erase operation and a write operation may be repeatedly performed in the memory cell MC. Accordingly, a data storage material may be determined so that a threshold voltage may be sufficiently shifted even though the number of cycles increases. Since the floating gate FG stores electrons in a conductive band, the voltage level of a program bias may be high and the tunneling layer may have a large thickness. When the tunneling layer is thick, charges may be trapped in the tunneling layer resulting in reduced reliability. However, since the charge trap layer 14B traps charges at trap sites within a band gap, the voltage level of the program bias may be small and the second tunneling layer 14C2 may have a small thickness. Accordingly, by using the charge trap layer 14B as the data storage of the memory cell MC, it is possible to reduce the trapping of charges in the second tunneling layer 14C2 compared to the floating gate FG, and even though the number of cycles increases, the threshold voltage may be sufficiently shifted. Unlike the floating gate FG, since the charge trap layer 14B is not a conductor, interference between adjacent memory cells MC may be reduced and distribution of the threshold voltages Vth of programmed memory cells MC may be improved.

The select transistor STR may include the floating gate FG and the charge trap layer 14B. The charge trap layer 14B of the select transistor STR may be used as a dielectric layer for separating the floating gate FG and the select line SLN together with the second 10) tunneling layer 14C2 and the blocking layer 14A. The select transistor STR may be programmed in a manufacturing process, and charge may be stored in the floating gate FG. The threshold voltage Vth of the select transistor STR may be determined according to the amount of charge stored in the floating gate FG. The select transistor STR having a large amount of charge may have a higher threshold voltage Vth than the select transistor STR having a small amount of charge.

The select transistor STR may be used as a switch for controlling a connection between a memory string and a bit line. The select transistor STR may be used as a switch for controlling a connection between the memory string and a source line. Accordingly, in terms of the operating characteristics, the select transistor STR needs to keep the threshold voltage Vth constant and high-temperature retention characteristics are required. The floating gate FG and the charge trap layer 14B have different conduction band offsets. For example, a conductive band offset of the floating gate FG including polysilicon may be 3.2 eV, and a conductive band offset of the charge trap layer 14B including nitride may be 2.55 eV. Accordingly, the floating gate FG may have a larger energy barrier than the charge trap layer 14B, and the floating gate FG is put into in the select transistor STR, thereby reducing variations in the threshold voltage. When the floating gate FG is used as a data storage, a thick tunneling layer may be required, but the select transistor STR may include a thin tunneling layer since an erase operation and a write operation are not repeatedly performed. Accordingly, the memory cells MC and the select transistor STR may share the second tunneling layer 14C2 having a small thickness. By separating the floating gates FG of adjacent select transistors STR from each other, variations in the threshold voltage Vth of the select transistor may be reduced.

Figure 2A:
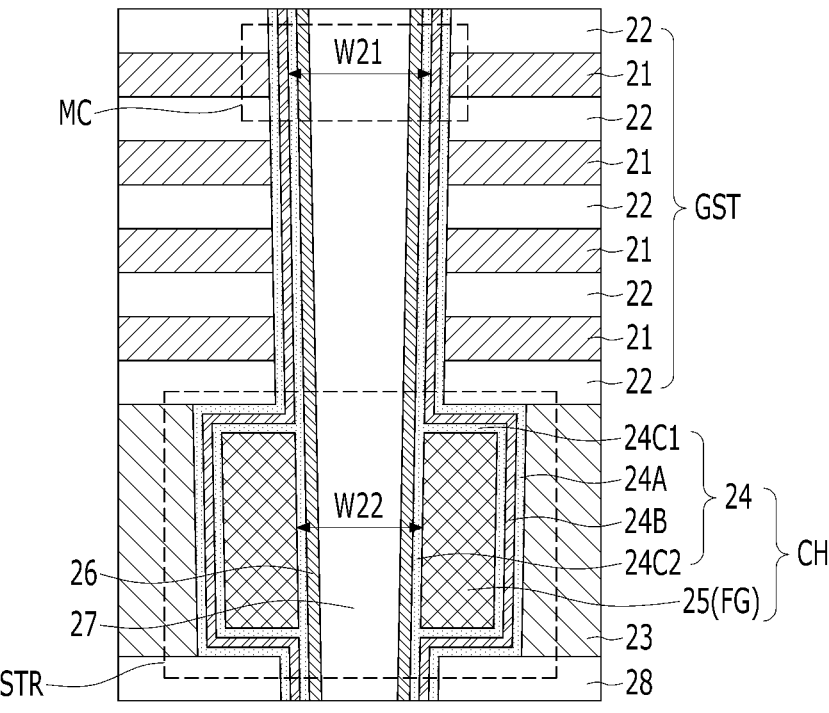
FIGS. 2A and 2B are diagrams illustrating the structure of a semiconductor device in accordance with another embodiment.
Figure 2B:
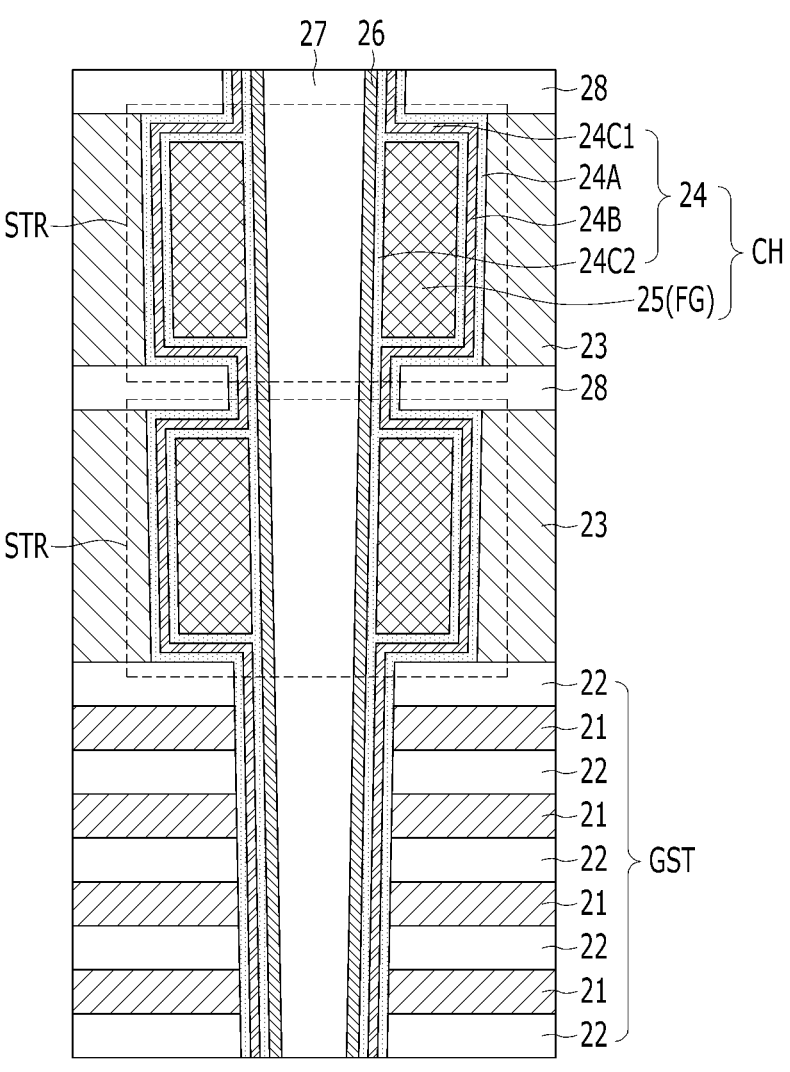

FIGS. 2A and 2B are diagrams illustrating the structure of a semiconductor device in accordance with another embodiment. Hereinafter, content which may overlap with previously described content may be omitted or described only briefly.

Referring to FIG. 2A, the semiconductor device may include a gate structure GST, a second conductive layer 23, and a channel structure CH. The semiconductor device may further include a second insulating layer 28 and an insulating core 27.

The gate structure GST may include first conductive layers 21 and first insulating layers 22 that are alternately stacked. As an example, the second conductive layer 23 may be the select line, and the first conductive layers 21 may be the word lines. In a variation of the illustrated embodiment, the second conductive layer 23 and at least an uppermost one of the first conductive layers 21 may be the select lines, and the other first conductive layers 21 may be the word lines. The channel structure CH may include at least one of a first memory layer 24, a second memory layer 25, and a channel layer 26. The first memory layer 24 may include a first tunneling layer 24C1, a second tunneling layer 24C2, a charge trap layer 24B, or a blocking layer 24A, or a combination thereof. The second memory layer 25 may include a floating gate FG.

The gate structure GST may be located above the second conductive layer 23. The memory cells MC may be located above a select transistor STR, and the channel layer 26 of the select transistor STR may have a narrower width than the channel layer 26 of the memory cells MC. The channel layer 26 of the memory cell MC may have a first width W21, and the channel layer 26 of the select transistor STR may have a second width W22 smaller than the first width W21.

Referring to FIG. 2B, second conductive layers 23 and second insulating layers 28 may be alternately stacked on the gate structure GST. The select transistors STR may be stacked along the channel structure CH. in an embodiment, the plurality of the second conductive layers 23 and the plurality of the second insulating layers 28 may also be located below the gate structure GST.

Figure 3A:
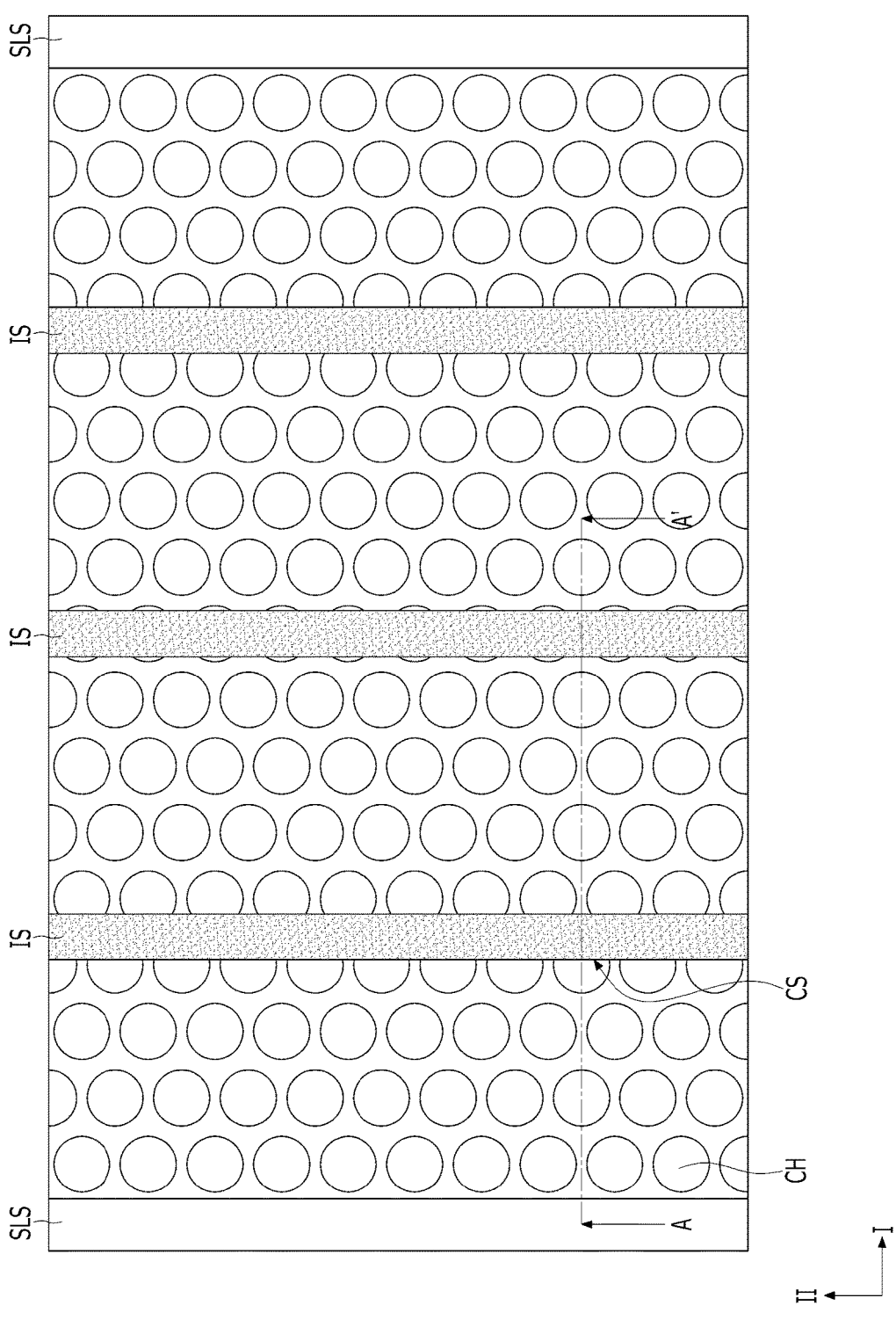
FIGS. 3A to 3D are diagrams illustrating the structure of a semiconductor device in accordance with yet another embodiment.
Figure 3B:
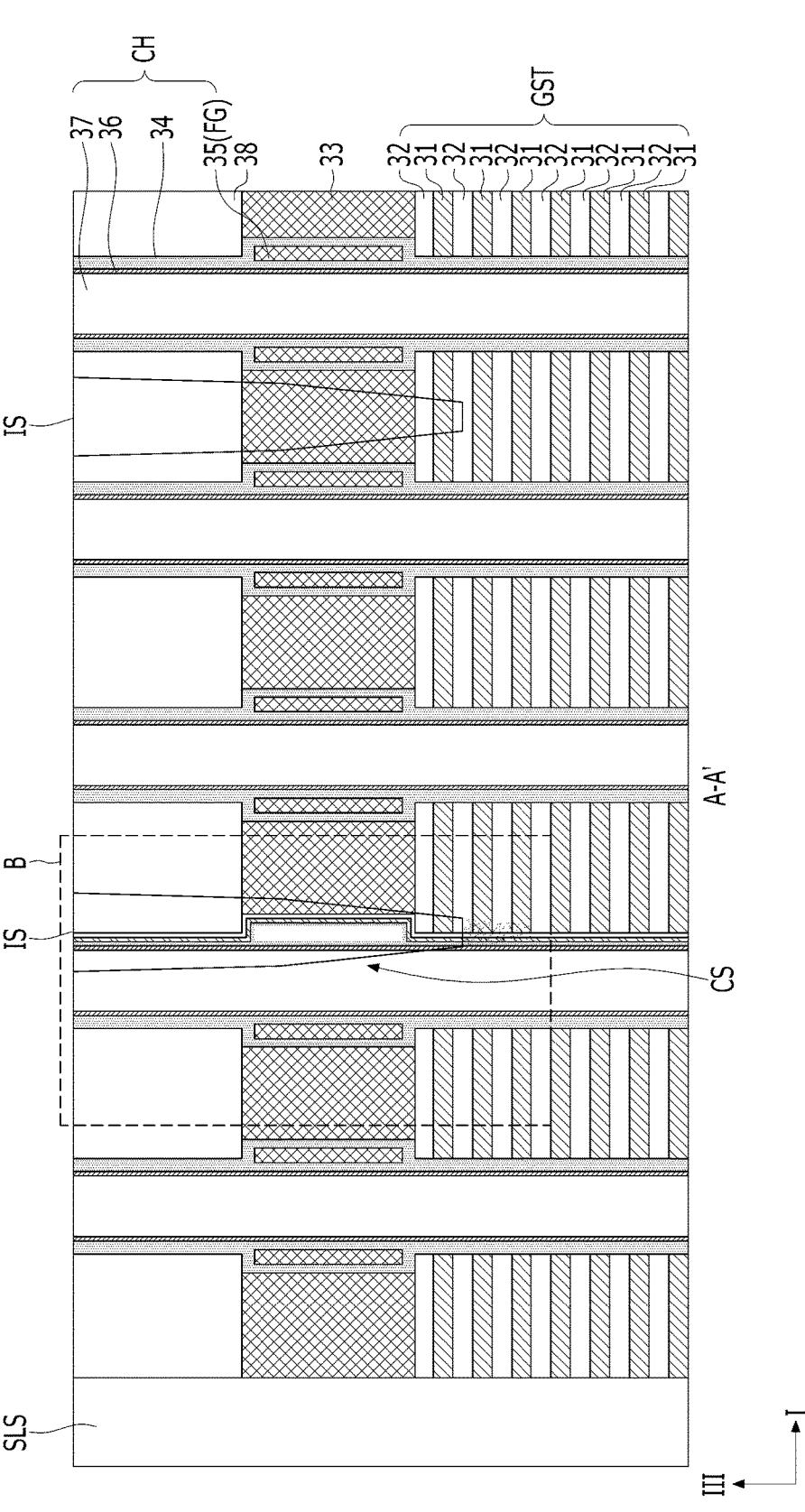
Figure 3C:
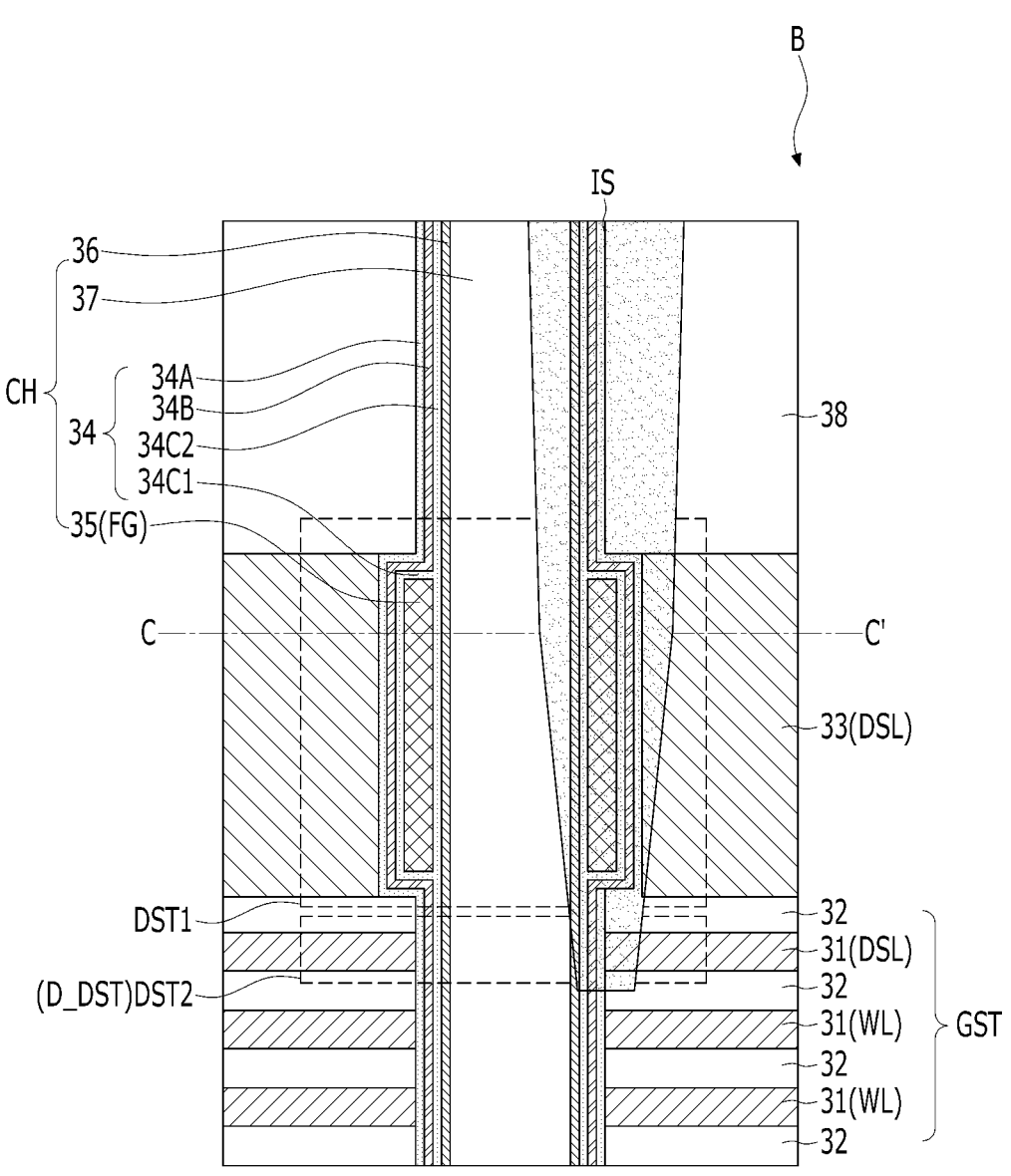
Figure 3D:
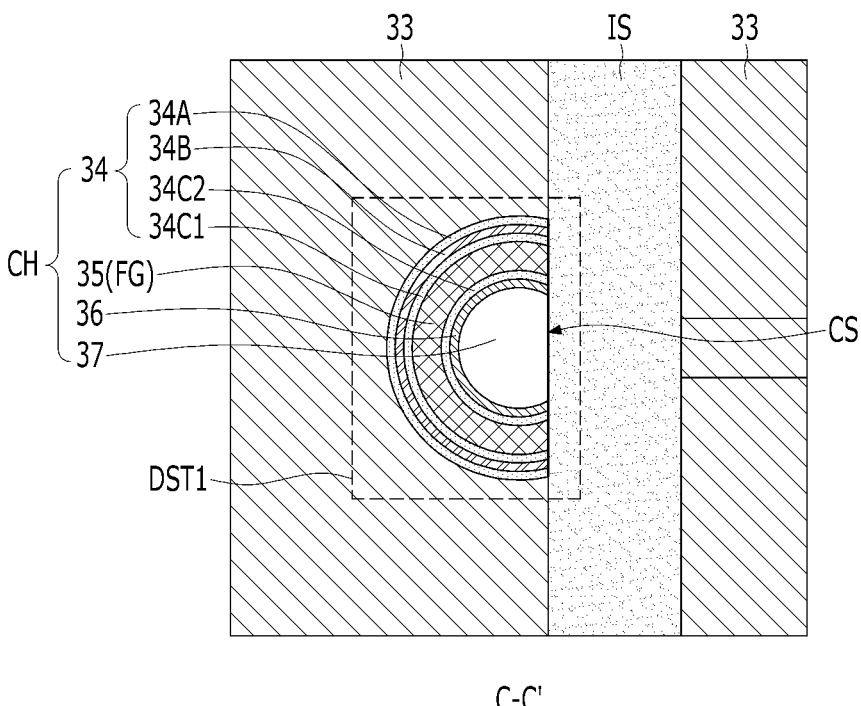

FIGS. 3A to 3D are diagrams illustrating the structure of a semiconductor device in accordance with yet another embodiment. FIG. 3B is a cross-sectional view taken along line A-A' in FIG. 3A, FIG. 3C is an enlarged view of region B in FIG. 3B, and FIG. 3D is a cross-sectional view taken along line C-C' of FIG. 3C. Hereinafter, any content overlapping with the previously described content may be omitted or described briefly.

Referring to FIGS. 3A and 3B, the semiconductor device may include at least one of gate structures GST, a second conductive layer 33, channel structures CH, a second insulating layer 38, an isolation structure IS, and a slit structure SLS.

The gate structure GST may include first conductive layers 31 and first insulating layers 32 that are alternately stacked. At least one second conductive layer 33 and at least one second insulating layer 38 may be located on the gate structure GST. The channel structure CH may extend into the gate structure GST through the second conductive layer 33. The channel structure CH may include at least one of a first memory layer 34, a second memory layer 35, a channel layer 36, and an insulating core 37.

The first memory layer 34 may surround the channel layer 36. The first memory layer 34 may be located between the channel layer 36 and the gate structure GST, and may extend between the channel layer 36 and the second conductive layer 33. The first memory layer 34 may include a charge trap layer. The second memory layer 35 may be located between the channel layer 36 and the second conductive layer 33. The second memory layer 35 may be located in the first memory layer 34 and may include a floating gate FG.

The isolation structure IS may be used to isolate select lines located at the same level from each other. The isolation structure IS may be located between the channel structures CH. The isolation structure IS may be spaced apart from the channel structures CH on both sides thereof or may overlap the channel structures CH on both sides thereof. The channel structure CH overlapping the isolation structure IS may include a cutting surface CS contacting the isolation structure IS. The isolation structure IS may pass through the second conductive layer 33, and extend into the gate structure GST. The isolation structure IS may include an insulating material such as an oxide, a nitride, an air gap, or a void.

A slit structure SLS may be located between consecutively stacked gate structures GST. The gate structures GST adjacent to each other in the first direction I may be insulated from each other by a slit structure SLS. The slit structure SLS may include at least one of an insulating material, semiconductor material and a conductive material. The slit structure SLS may include an insulating material such as an oxide, a nitride, an air gap, or a void. The slit structure SLS may include a semiconductor material such as an amorphous silicon. The slit structure SLS may include a conductive material such as a polysilicon, or a metal. As an example, the slit structure SLS may include a source contact structure electrically connected to a source line and an insulating spacer surrounding sidewalls of the source contact structure.

The isolation structure IS and the slit structure SLS may be adjacent to each other in the first direction I. The isolation structure IS and the slit structure SLS may extend in the second direction II intersecting the first direction I. The isolation structure IS and the slit structure SLS may have different depths. The isolation structure IS may have a smaller height than the slit structure SLS.

Referring to FIGS. 3C and 3D, the gate structure GST may include word lines WL and select lines, and at least uppermost one of the first conductive layers 31 and the second conductive layer 33 may be drain select lines DSL. The isolation structure IS may extend into the gate structure GST through the second insulating layer 38 and the second conductive layer 33. The isolation structure IS may be formed to a depth by which the drain select lines DSL are passed through and the word lines WL are not passed through.

At least one of the channel structures CH may overlap the isolation structure IS. The channel structure CH overlapping the 20) isolation structure IS may include a cutting surface CS facing the isolation structure IS. At least one of a first tunneling layer 34C1, a charge trap layer 34B, a blocking layer 34A, a second tunneling layer 34C2, and the insulating core 37 may be exposed through the cutting surface CS. The cutting surface CS may come into contact with the isolation structure IS.

A planar shape of the channel structure CH at a level including the cutting surface CS and a planar shape of the channel structure CH at a level including no cutting surface CS may be different from each other. At the level including no cutting surface CS, the channel structure CH may have a normal shape such as a circular shape, an elliptical shape, or a polygonal shape. At the level including the cutting surface CS, the channel structure CH may have a shape in which a normal shape such as a circle, an ellipse, or a polygon is partially cut off.

A first drain select transistor DST1 may be located in a region where the channel structure CH and the second conductive layer 33 intersect each other. The first drain select transistor DST1 may include the charge trap layer 34B and the floating gate FG. The floating gate FG may be located between the channel layer 36 and the second conductive layer 33, and may partially surround the channel layer 36. In the plan view, the floating gate FG may partially surround the sidewalls of the channel layer 36. A portion of the sidewalls of the channel layer 36 corresponding to the cutting surface CS might not be surrounded by the floating gate FG, and the remaining sidewalls may be surrounded by the floating gate FG.

A second drain select transistor DST2 may be located in a region where the channel structure CH and the uppermost first conductive layer 31 intersect each other. The second drain select transistor DST2 may include the charge trap layer 34B and include no floating gate FG. The second drain select transistor DST2 may be used as a real select transistor that controls a connection between a bit line and a memory string, or may be used as a dummy drain select transistor D_DST. As an example, the first drain select transistor DST1 may be used as a real select transistor and the second drain select transistor DST2 may be used as a dummy drain select transistor D_DST.

According to the structure described above, the isolation structure IS and the channel structure CH may overlap each other, and the channel structure CH overlapping the isolation structure IS may have a shape in which the channel structure CH is not completely surrounded by the second conductive layer 33. When the channel structure CH is partially cut, only a part of the channel layer 36 is surrounded by the drain select line DSL, and an electric field may be concentrated on an edge of the cut surface CS. This may degrade data retention characteristics of the first drain select transistor DST1 and cause leakage current. Accordingly, electron distribution may be improved by adding the floating gate FG to the first drain select transistor DST1. Since the floating gate FG includes a conductive material having conductivity, electrons may be uniformly distributed compared to the charge trap layer 34B, and concentration of electrons on the edge of the cutting surface CS may be alleviated. Accordingly, data retention characteristics may be improved and leakage current may be reduced.

Figure 4:
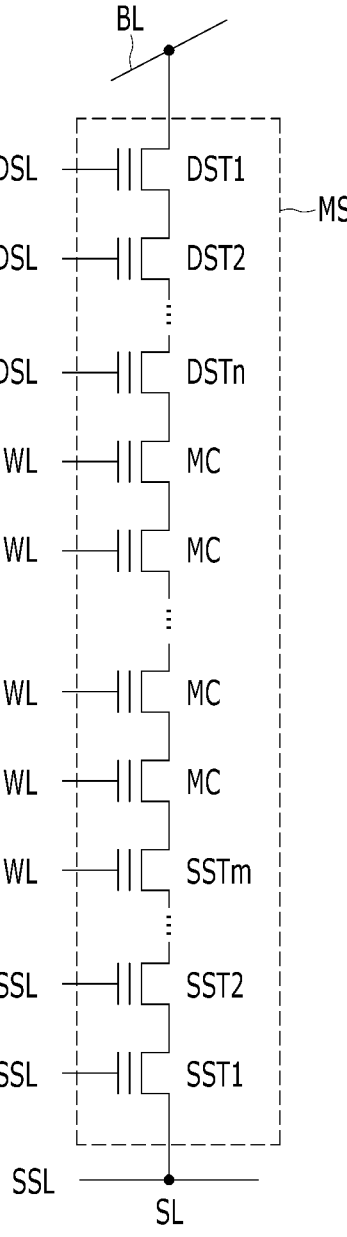
FIG. 4 is a diagram for describing the configuration of a semiconductor device in accordance with an embodiment.

FIG. 4 is a diagram for describing the configuration of a semiconductor device in accordance with yet another embodiment. Hereinafter, any content overlapping with the previously described content may be omitted or described only briefly.

Referring to FIG. 4, the semiconductor device may include a source line SL, a bit line BL, and a memory string MS. The memory string MS may be connected between the source line SL and the bit line BL. The memory string MS may include one or more source select transistors SST1 to SSTm, a plurality of memory cells MC, and one or more drain select transistors DST1 to DSTn, wherein n and m may be integers equal to or greater than 2.

The source select transistors SST1 to SSTm may control a connection between the memory string MS and the source line SL. The drain select transistors DST1 to DSTn may control a connection between the memory string MS and the bit line BL. The number of source select transistors SST1 to SSTm and the number of drain select transistors SST1 to SSTn included in one memory string MS may be the same as each other or different from each other.

The memory cell MC may include a charge trap layer and include no floating gate. The select transistors SST1 to SSTm and DST1 to DSTn may each include the charge trap layer and the floating gate, or may each include the charge trap layer and include no floating gate.

As an example, the first drain select transistor DST1 may include the charge trap layer and the floating gate, and the second to $n^{th}$ drain select transistors DST2 to DSTn may each include the charge trap layer and include no floating gate. The first to $m^{th}$ source select transistors SST1 to SSTm may each include the charge trap layer and include no floating gate.

As an example, the first source select transistor SST1 may include the charge trap layer and the floating gate, and the second to $m^{th}$ source select transistors SST2 to SSTm may each include the charge trap layer and include no floating gate. The first to $n^{th}$ drain select transistors SST1 to SSTn may each include the charge trap layer and include no floating gate.

As an example, the first drain select transistor DST1 may include the charge trap layer and the floating gate, and the second to $n^{th}$ drain select transistors DST2 to DSTn may each include the charge trap layer and include no floating gate. The first source select transistor SST1 may include the charge trap layer and the floating gate, and the second to $m^{th}$ source select transistors SST2 to SSTm may each include the charge trap layer and include no floating gate.

The semiconductor device may include a plurality of memory strings, and a select transistor may include a charge trap layer and a floating gate for some of the plurality of memory strings. A threshold voltage of the select transistor may be determined according to the amount of charge stored in the floating gate. The select transistor may be programmed in a process of manufacturing or testing the semiconductor device, and a threshold voltage Vth of the select transistor may be determined according to a programmed state.

According to the configuration described above, a memory string may include a select transistor including a charge trap layer and a floating gate. By putting the floating gate into the select transistor, a threshold voltage of the select transistor may be maintained.

FIGS. 5A to 5F describe a manufacturing method of a semiconductor device in accordance with an embodiment. Hereinafter, any content overlapping with the previously described content may be omitted or only briefly described.

Figure 5A:
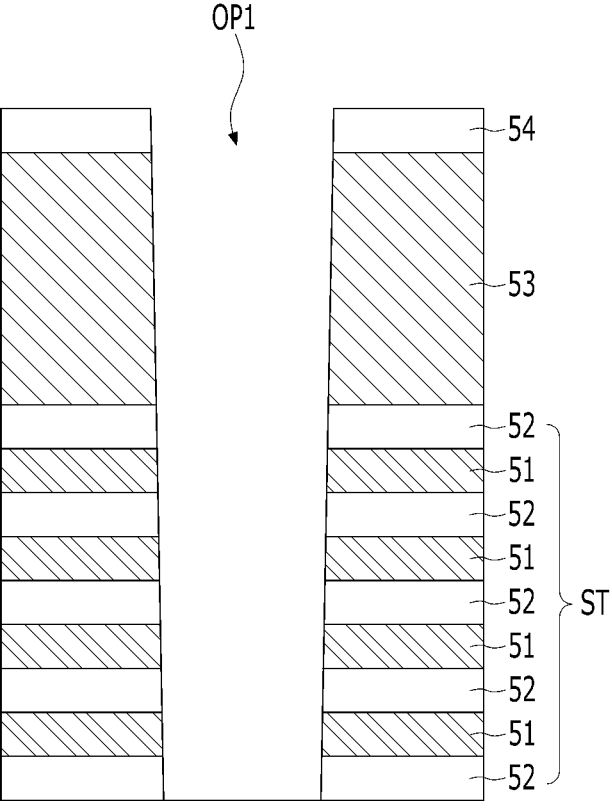
FIGS. 5A to 5F are diagrams for describing a manufacturing method of a semiconductor device in accordance with an embodiment.

Referring to FIG. 5A, a stack ST including first material layers 51 and first insulating layers 52 that are alternately stacked may be formed. The first material layers 51 may be used to form gate lines such as word lines and select lines, and the first insulating layers 52 may be used to separate the stacked gate lines from each other. For example, the first material layer 51 may include a sacrificial material such as nitride. As another example, the first material layer 51 may include a conductive material such as polysilicon or metal. The first insulating layer 52 may include an insulating material such as an oxide, a nitride, an air gap, or a void.

Subsequently, a second material layer 53 may be formed on the stack ST. As an example, at least one second material layer 53 and at least one second insulating layer 54 may be alternately formed. The second material layer 53 may be used to form gate lines such as word lines and select lines, and the second insulating layer 54 may be used to separate the stacked gate lines from each other. For example, the second material layer 53 may include a sacrificial material such as nitride. As another example, the second material layer 53 may include a conductive material such as polysilicon or metal. The second insulating layer 54 may include an insulating material such as an oxide, a nitride, an air gap, or a void.

Subsequently, a first opening OP1 extending into the stack ST through the second material layer 53 may be formed. The first opening OP1 may have a depth by which the second insulating layer 54, the second material layer 53, and the stack ST are passed through. The first material layers 51 and the second material layers 53 may be exposed through the first opening OP1.

Figure 5B:
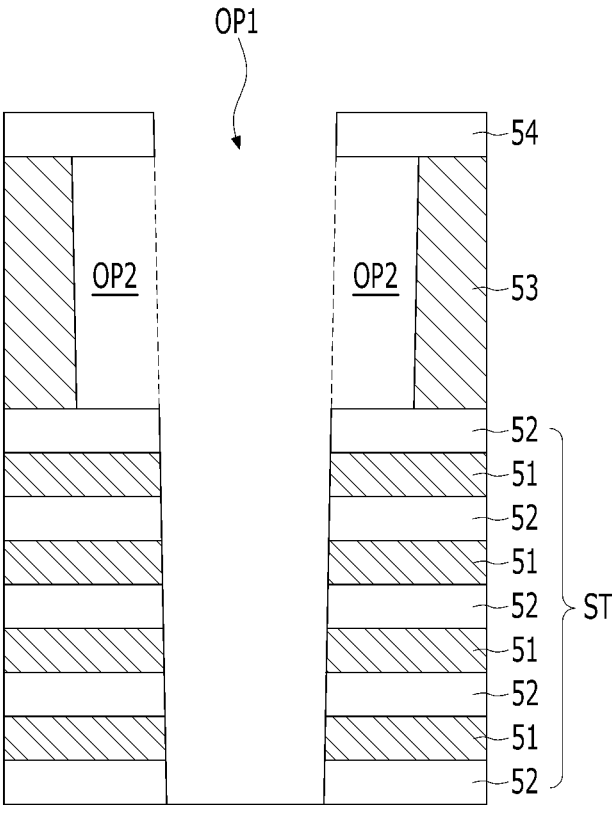

Referring to FIG. 5B, a second opening OP2 may be formed by etching the second material layer 53 through the first opening OP1. The second opening OP2 may be formed by selectively etching the second material layer 53. The second opening OP2 may be connected to the first opening OP1. The second opening OP2 may be formed to surround the first opening OP1 at the level of the second material layer 53.

Figure 5C:
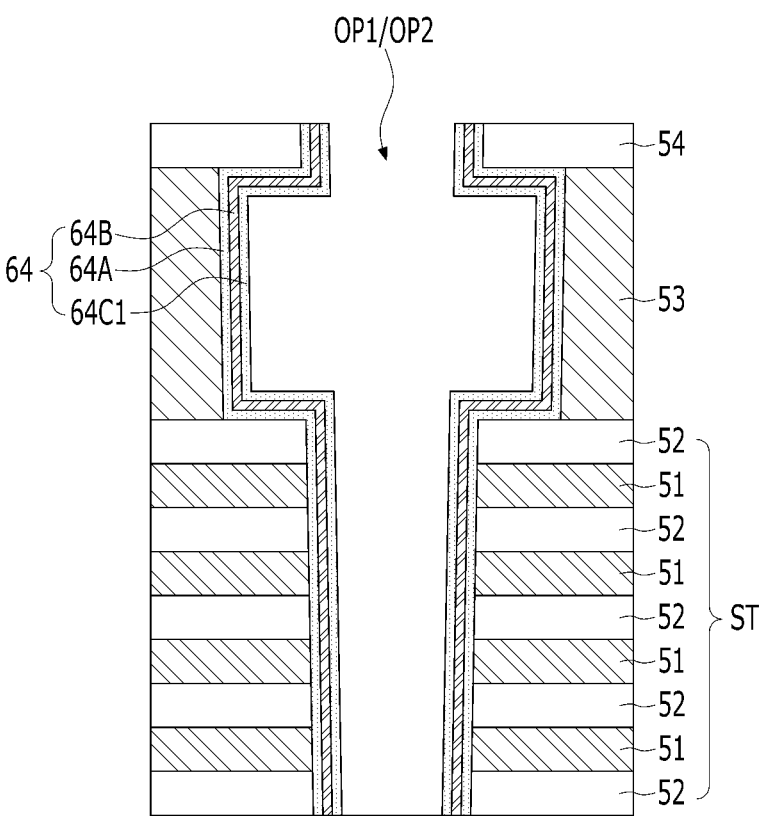

Referring to FIG. 5C, a first memory layer 64 may be formed in the first opening OP1 and the second opening OP2. The first memory layer 64 may include at least one of a blocking layer 64A, a charge trap layer 64B, and a first tunneling layer 64C1. The first memory layer 64 may be formed along inner surfaces of the first opening OP1 and the second opening OP2. As an example, the blocking layer 64A may be formed in the first opening OP1 and the second opening OP2. Subsequently, the charge trap layer 64B may be formed in the blocking layer 64A. Subsequently, the first tunneling layer 64C1 may be formed in the charge trap layer 64B.

Figure 5D:
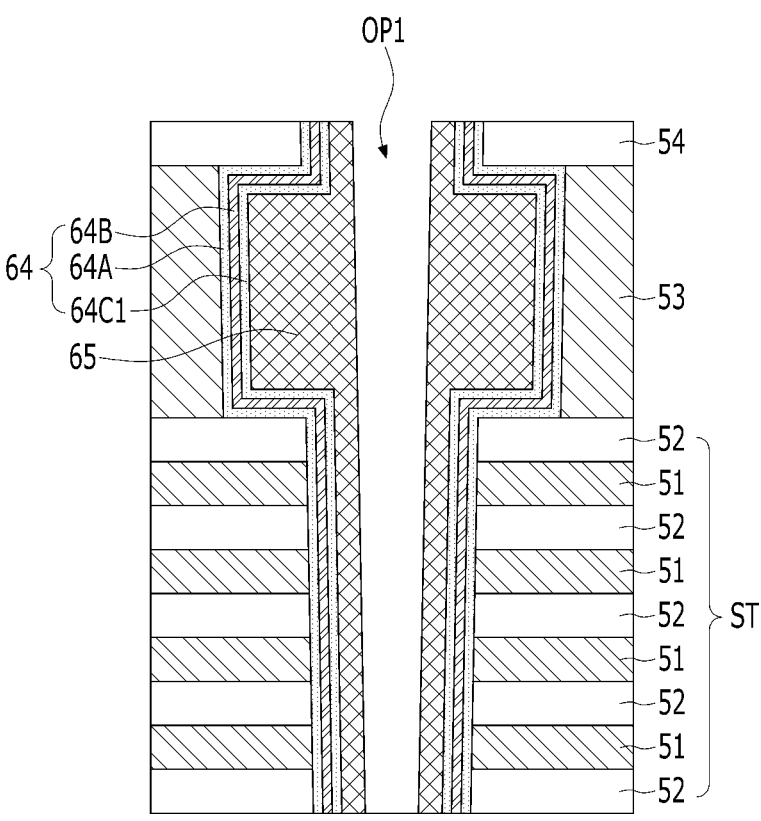
Figure 5E:
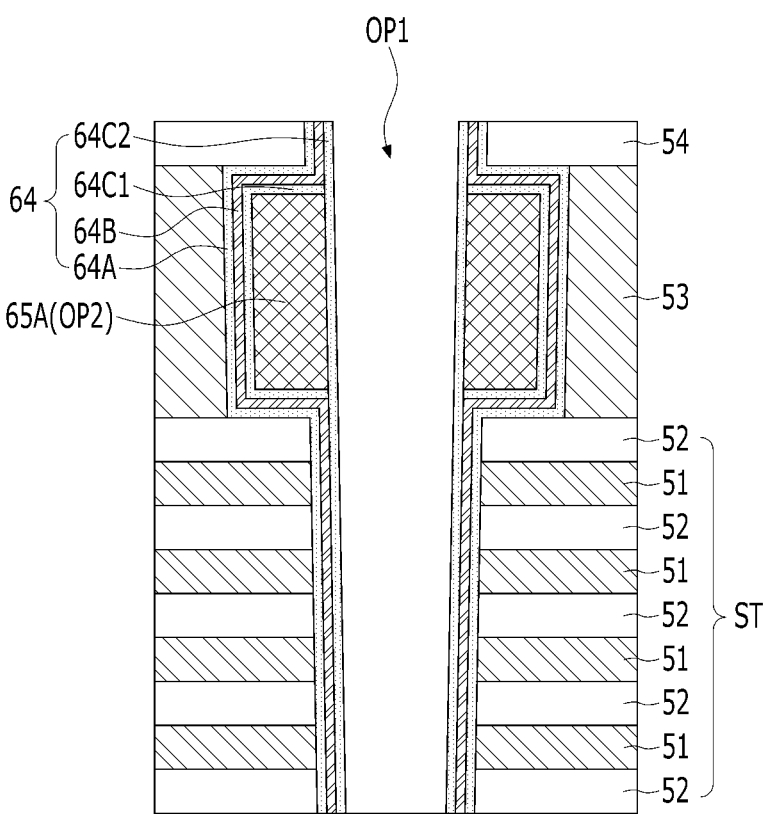

Referring to FIGS. 5D and 5E, a second memory layer 65A may be formed in the second opening OP2. The second memory layer 65A may include a floating gate. As an example, the floating gate may be formed in the first opening OP1 and the second opening OP2 by depositing and etching a polysilicon layer.

First, referring to FIG. 5D, a second memory layer 65 may be formed in the first opening OP1 and the second opening OP2. The second memory layer 65 may be formed to a thickness by which the second opening OP2 is filled and the first opening OP1 is partially opened. The second memory layer 65 may include a polysilicon layer.

Subsequently, referring to FIG. 5E, the second memory layer 65 may be etched. Through this, a portion of the second memory layer 65 formed in the first opening OP1 may be etched, and a portion of the second memory layer 65 formed in the second opening OP2 May remain. Through this, the second memory layer 65A located in the second opening OP2 may be formed. In the process of etching the second memory layer 65, the first tunneling layer 64C1 may be partially etched. A portion of the first tunneling layer 64C1 formed in the first opening OP1 may be etched. The remaining first tunneling layer 64C1 may have a C-shaped cross section. As the first tunneling layer 64C1 is partially etched, the charge trap layer 64B may be exposed in the first opening OP1.

Subsequently, a second tunneling layer 64C2 may be formed in the first opening OP1. The second tunneling layer 64C2 may be formed on the second memory layer 65A. The second tunneling layer 64C2 may be formed on the first tunneling layer 64C1 or on the charge trap layer 64B.

Figure 5F:
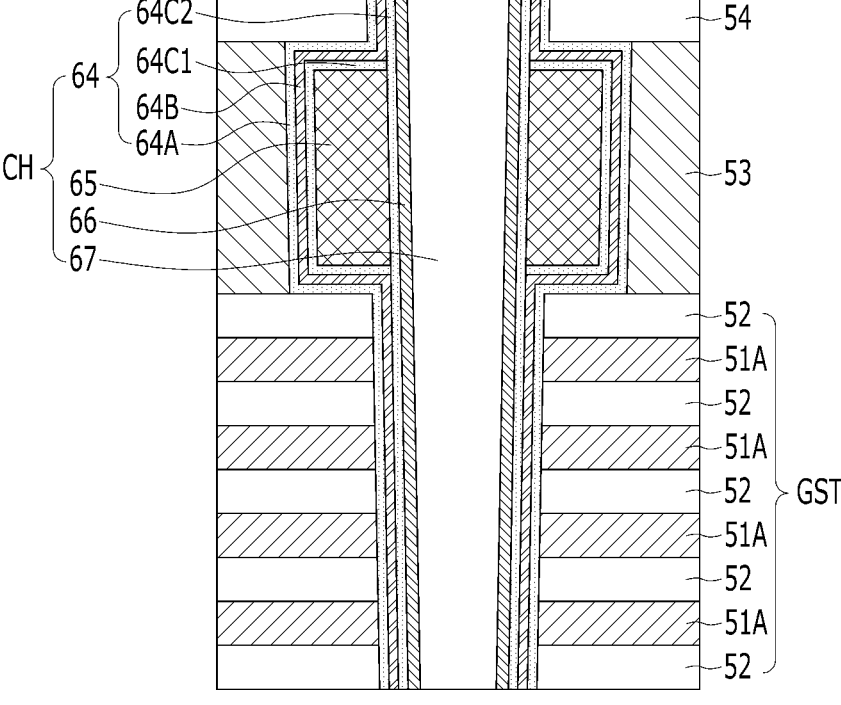

Referring to FIG. 5F, a channel layer 66 may be formed in the first opening OP1. The channel layer 66 may be formed to a thickness by which the first opening OP1 is at least partially filled. When the channel layer 66 is formed to partially fill the first opening OP1, an insulating core 67 may be formed in the channel layer 66.

Subsequently, the first material layers 51 may be replaced with conductive layers 51A. As an example, a slit passing through the second material layer 53 and the first material layers 51 may be formed, and the first material layers 51 may be removed through the slit. Subsequently, the conductive layers 51A may be formed in regions where the first material layers 51 are removed. Through this, a gate structure GST including the conductive layers 51A and the first insulating layers 52 that are alternately stacked may be formed. In a case in which the second material layer 53 includes a sacrificial material, the second material layer 53 may also be replaced with a conductive layer when the first material layers 51 are replaced with the conductive layers 51A.

According to the manufacturing method described above, a select transistor including the first memory layer 64 and the second memory layer 65 and a memory cell including the first memory layer 64 may be formed. The first memory layer 64 may include the charge trap layer 64B, and the second memory layer 65 may include the floating gate. Different types of data storage layers may be included in a memory cell and a select transistor according to operating characteristics of the memory cell whose threshold voltage is changed in order to store data and of the select transistor having a fixed threshold voltage as a switch.

Figure 6A:
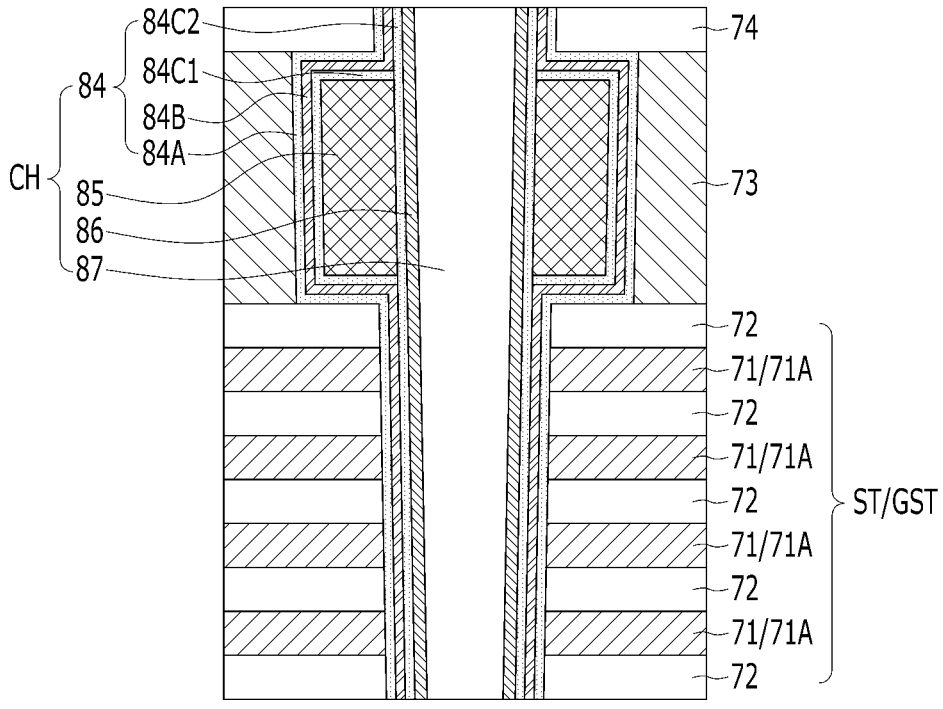
FIGS. 6A to 6C are diagrams for describing a manufacturing method of a semiconductor device in accordance with an embodiment.
Figure 6B:
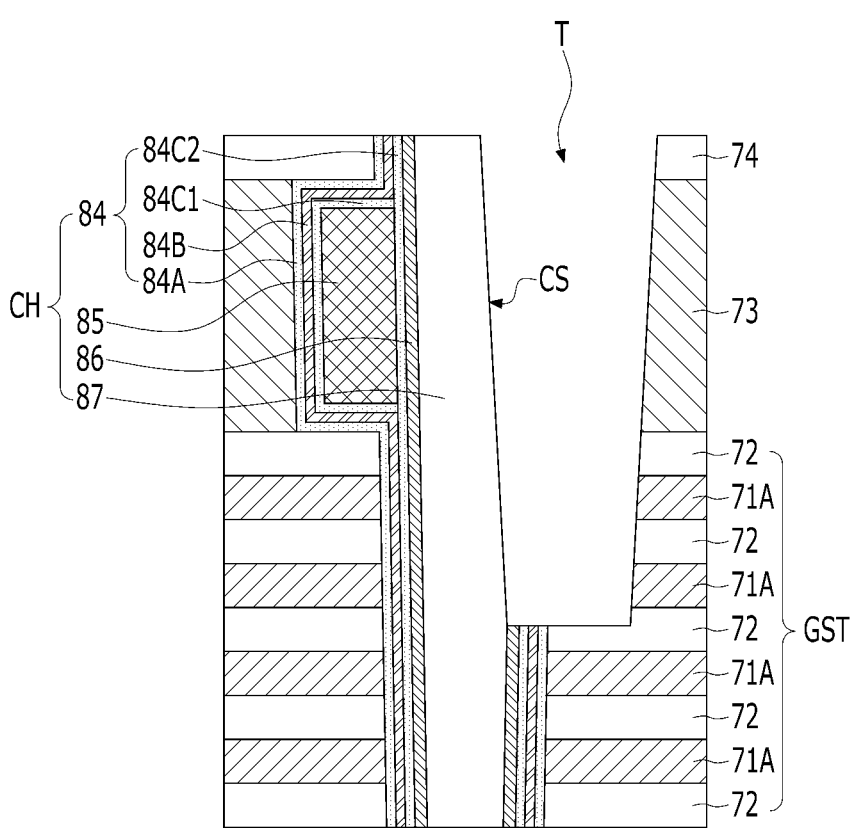
Figure 6C:
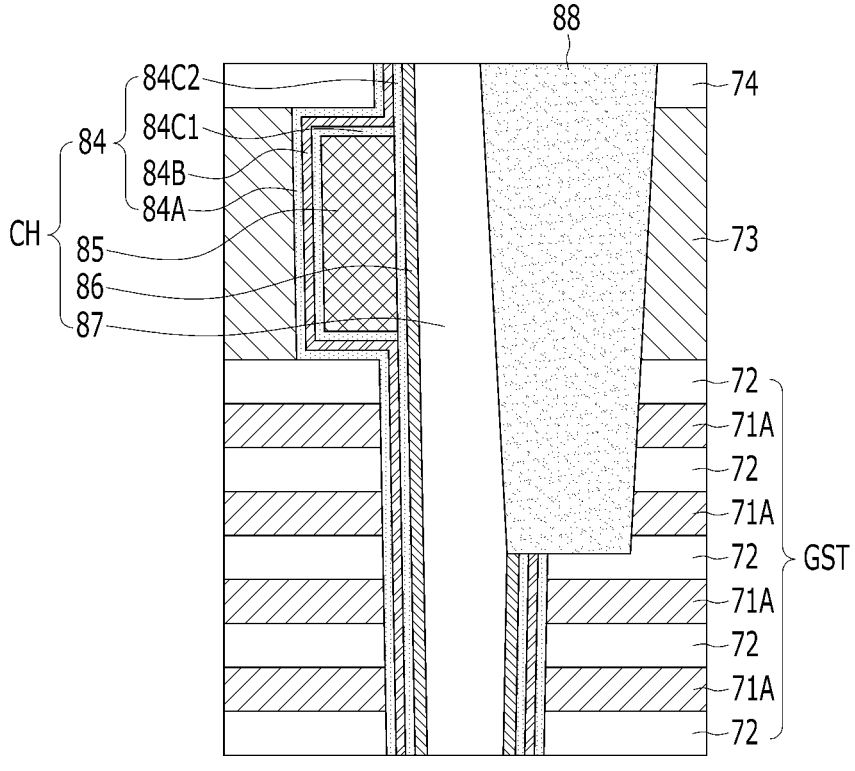

FIGS. 6A to 6C illustrate a manufacturing method of a semiconductor device in accordance with an embodiment. Hereinafter, the content overlapping with the previously described content will be omitted.

Referring to FIG. 6A, a stack ST including first material layers 71 and first insulating layers 72 that are alternately stacked may be formed. Subsequently, a second material layer 73 and a second insulating layer 74 may be formed on the stack ST. Subsequently, a 20) channel structure CH extending into the stack ST through the second material layer 73 may be formed. First, a first memory layer 84 may be formed. The first memory layer 84 may include at least one of a blocking layer 84A, a charge trap layer 84B, a first tunneling layer 84C1, and a second tunneling layer 84C2. Subsequently, a second memory layer 85 may be formed. The second memory layer 85 may include a floating gate. Subsequently, a channel layer 86 and an insulating core 87 may be formed.

Subsequently, the first material layers 71 may be replaced with conductive layers 71A. Through this, a gate structure GST including the conductive layers 71A and the first insulating layers 72 that are alternately stacked may be formed.

Referring to FIG. 6B, a trench T may be formed. The trench T may extend into the gate structure GST through the second material layer 73. The trench T may have a depth by which at least the uppermost one of the conductive layers 71A is passed through. As an example, the trench T may be formed to a depth by which a select line is passed through and word lines are not passed through in the conductive layers 71A.

In the process of forming the trench T, the channel layer 86 may be partially etched. As an example, the trench T may be formed by etching the second material layer 73, the channel layer 86, the first memory layer 84, and the second memory layer 85. When the insulating core 87 is formed in the channel layer 86, the insulating core 87 may be partially etched when the trench T is formed. A cutting surface CS of the channel structure CH may be defined by the trench T. At least one of the first memory layer 84, the second memory layer 85, the channel layer 86, and the insulating core 87 may be exposed by the cutting surface CS.

Referring to FIG. 6C, an isolation structure 88 may be formed in the trench T. The isolation structure 88 may include an insulating material such as an oxide, a nitride, an air gap, or a void. Select lines located at the same level may be isolated from each other by the isolation structure 88.

According to the manufacturing method described above, a select transistor including the first memory layer 84 and the second memory layer 85 can be formed. The first memory layer 84 may include the charge trap layer 84B, and the second memory layer 85 may include the floating gate. Accordingly, even though the channel structure CH is partially cut by the isolation structure 88, variations in the threshold voltage of the select transistor may be reduced.

Although embodiments according to the technical idea of the present invention disclosure have been described above with reference to the accompanying drawings, this is only for explaining the embodiments according to the concept of the present invention disclosure, and the present invention disclosure is not limited to the above embodiments. Various types of substitutions, modifications, and changes for the embodiments may be made by those skilled in the art, to which the present invention disclosure pertains, without departing from the technical idea of the present invention disclosure defined in the following claims, and it should be construed that these substitutions, modifications, and changes belong to the scope of the present invention disclosure.

What is claimed is:

1. A semiconductor device comprising:
   a plurality of word lines;
   a select line;
   a channel layer extending into the select line through the word lines;
   a floating gate surrounding a sidewall of the channel layer between the channel layer and the select line; and
   a charge trap layer including a first and a second portion, wherein the first portion surrounds the sidewall of the channel layer between the channel layer and the word lines and the second portion surrounds the floating gate between the channel layer and the select line.

2. The semiconductor device of claim 1, wherein a select transistor is located in a region where the channel layer and the select line intersect each other, and includes the charge trap layer and the floating gate.

3. The semiconductor device of claim 1, wherein memory cells are located in regions where the channel layer and the word lines intersect each other, and each of the memory cells includes the charge trap layer.

4. The semiconductor device of claim 1, further comprising:

a first tunneling layer located between the second portion of the charge trap layer and the floating gate; and a second tunneling layer located between the first portion of the charge trap layer and the channel layer, and extending between the channel layer and the floating gate.

5. The semiconductor device of claim 1, further comprising:

a blocking layer surrounding the charge trap layer.

6. The semiconductor device of claim 1, wherein the select line has a greater height than the word lines.

7. The semiconductor device of claim 1, wherein the word lines each include metal and the select line includes poly-silicon.

8. The semiconductor device of claim 1, wherein the word lines and the select line each include metal.

9. The semiconductor device of claim 1, wherein the floating gate is disposed over the plurality of word lines.

10. A semiconductor device comprising:

a gate structure including first conductive layers and insulating layers that are alternately stacked;

a second conductive layer;

an isolation structure disposed over a plurality of word lines and extending into the gate structure through the second conductive layer and a floating gate;

a channel layer extending into the gate structure through the second conductive layer, and including a cutting surface facing the isolation structure; and the floating gate partially surrounding the channel layer and located between the channel layer and the second conductive layer.

11. The semiconductor device of claim 10, further comprising:

a charge trap layer surrounding the channel layer and located between the channel layer and the gate structure.

12. The semiconductor device of claim 11, wherein the charge trap layer extends between the floating gate and the second conductive layer.

13. The semiconductor device of claim 11, further comprising:

a first tunneling layer located between the floating gate and the charge trap layer.

14. The semiconductor device of claim 11, further comprising:

a second tunneling layer surrounding the channel layer and located between the channel layer and the charge trap layer and between the channel layer and the floating gate.

15. The semiconductor device of claim 10, wherein the second conductive layer and at least lowermost one of the first conductive layers are select lines, and the other first conductive layers are word lines.

16. The semiconductor device of claim 10, wherein the second conductive layer and at least uppermost one of the first conductive layers are select lines, and the other first conductive layers are word lines.

17. A semiconductor device comprising:

a source line;

a bit line; and a memory string connected between the source line and the bit line, the memory string including a first select transistor and memory cells, wherein the first select transistor includes a charge trap layer and a floating gate, and each of the memory cells includes the charge trap layer and does not include the floating gate.

18. The semiconductor device of claim 17, wherein the memory string includes a second select transistor connected between the first select transistor and the memory cells and including the charge trap layer.

19. The semiconductor device of claim 17, wherein the first select transistor is a source select transistor that controls a connection between the source line and the memory string.

20. The semiconductor device of claim 17, wherein the first select transistor is a drain select transistor that controls a connection between the bit line and the memory string.

\*    \*    \*    \*    \*